US006527918B2

(12) United States Patent
Goeckner et al.

(10) Patent No.: US 6,527,918 B2
(45) Date of Patent: Mar. 4, 2003

(54) METHOD AND APPARATUS FOR LOW VOLTAGE PLASMA DOPING USING DUAL PULSES

(75) Inventors: Matthew J. Goeckner, Plano, TX (US); Ziwei Fang, Sunnyvale, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/961,133

(22) Filed: Sep. 21, 2001

(65) Prior Publication Data

US 2002/0066668 A1 Jun. 6, 2002

Related U.S. Application Data

(62) Division of application No. 09/427,872, filed on Oct. 27, 1999, now Pat. No. 6,335,536.

(51) Int. Cl.[7] .......................... C23C 14/00; C23C 16/00; H05H 1/02; H01G 37/317

(52) U.S. Cl. ............................ 204/192.12; 204/192.11; 204/192.1; 427/523; 427/569; 250/492.3; 250/492.21; 250/492.23; 118/723 E

(58) Field of Search ....................... 204/192.12, 192.11, 204/192.1; 250/492.3, 492.21, 492.23; 118/723 E, 715, 723 R; 156/345.47, 345.43; 427/585, 569, 523; 315/111.21, 111.31, 111.61, 111.71, 111.81, 111.91, 111.01

(56) References Cited

U.S. PATENT DOCUMENTS 4,135,097 A 1/1979 Forneris et al.
4,595,837 A 6/1986 Wu et al.
4,764,394 A 8/1988 Conrad
4,786,814 A 11/1988 Kolondra et al.
4,839,011 A 6/1989 Ramalingam et al.
5,013,578 A * 5/1991 Brown et al. ................. 427/37
5,126,163 A 6/1992 Chan
5,282,944 A 2/1994 Sanders et al.
5,289,010 A 2/1994 Shohet
5,308,650 A 5/1994 Krummel et al.
5,354,381 A 10/1994 Sheng
5,558,718 A * 9/1996 Leung .................... 118/723 E
5,572,038 A 11/1996 Sheng et al.
5,654,043 A 8/1997 Shao et al.
5,711,812 A 1/1998 Chapek et al.
5,777,438 A * 7/1998 Suzuki .................. 315/111.81
5,838,522 A 11/1998 Komvopoulos
5,911,832 A 6/1999 Denholm et al.
5,970,907 A 10/1999 Takai et al.
6,050,218 A 4/2000 Chen et al.

FOREIGN PATENT DOCUMENTS

EP 0 480 689 4/1992
EP 0 747 927 2/1998
EP 0 994 203 4/2000

OTHER PUBLICATIONS

Kellerman, "PIII Dosimetry" Eaton, Implant System Division, Apr., 1999, pp. 1–13.

* cited by examiner

*Primary Examiner*—Gregory Mills
*Assistant Examiner*—P. Hassanzadeh

(57) ABSTRACT

A pulsed plasma doping system separates the plasma ignition function from the ion implantation function. An ignition voltage pulse is supplied to an ionizable gas and an implantation voltage pulse is applied to the target. The implantation voltage pulse can be generated from the ignition voltage pulse or can be generated separately from the ignition voltage pulse. Ions may be implanted in the target at an energy level that is below the Paschen curve for the system.

18 Claims, 6 Drawing Sheets

300'
24
202
20

300
202
24
20

METHOD AND APPARATUS FOR LOW VOLTAGE PLASMA DOPING USING DUAL PULSES

This application is a Divisional of prior application Ser. No. 09/427,872, filed on Oct. 27, 1999, entitled METHOD AND APPARATUS FOR LOW VOLTAGE PLASMA DOPING USING DUAL PULSES and now U.S. Pat. No. 6,335,536.

FIELD OF THE INVENTION

This invention relates to pulsed plasma processing systems used for ion implantation of workpieces and, more particularly, to methods and apparatus for operating such systems at low implant voltages.

BACKGROUND OF THE INVENTION

Ion implantation is a standard technique for introducing conductivity-altering impurities into semiconductor wafers. In a conventional ion implantation system, a desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Exacting requirements are placed on semiconductor fabrication processes involving ion implantation with respect to the cumulative ion dose implanted into the wafer, implant depth, dose uniformity across the wafer surface, surface damage and undesirable contamination. The implanted dose and depth determine the electrical activity of the implanted region, while dose uniformity is required to ensure that all devices on the semiconductor wafer have operating characteristics within specified limits. Excessive surface damage, particularly chemical etch, or contamination of the surface can destroy previously fabricated structures on the wafer.

In some applications, it is necessary to form shallow junctions in a semiconductor wafer, where the impurity material is confined to a region near the surface of the wafer. In these applications, the high energy acceleration and the related beam forming hardware of conventional ion implanters are unnecessary. Accordingly, it has been proposed to use Plasma Doping (PLAD) systems for forming shallow junctions in semiconductor wafers.

In a PLAD system, a semiconductor wafer is placed on a conductive platen located in a chamber, and the platen functions as a cathode. An ionizable gas containing the desired dopant material is introduced into the chamber, and a high voltage pulse is applied between the platen and an anode (or the chamber walls), causing the formation of a plasma having a plasma sheath in the vicinity of the wafer. The applied voltage causes ions in the plasma to cross the plasma sheath and to be implanted into the wafer. The depth of implantation is related to the voltage applied between the wafer and the anode. A plasma doping system is described in U.S. Pat. No. 5,354,381 issued Oct. 11, 1994 to Sheng.

In the PLAD system described above, the high voltage pulse generates the plasma and accelerates positive ions from the plasma toward the wafer. In other types of plasma implantation systems, known as Plasma-Source Ion Implantation, PSII, systems, a separate plasma source is used to provide a continuous plasma. (These implantation systems are also known by several other acronyms, the most common being Plasma-Immersion Ion implantation, PIII.) In such systems, the platen and the wafer are immersed in this continuous plasma and at intervals, a high voltage pulse is applied between the platen and the anode, causing positive ions in the plasma to be accelerated toward the wafer. Such a system is described in U.S. Pat. No. 4,764,394, issued Aug. 16, 1988 to Conrad.

An advantage of a PLAD system over a PSII system is that the plasma is on only when the target object is being implanted. This results in a reduction of chemically active species that are produced by the continuous plasma of the PSII system and hence a reduction in chemical damage to the wafer surface. In addition, the continuous plasma can also cause high levels of implanted contaminants and high levels of particulate formation. The PLAD system improves on the PSII system by turning the plasma off except when the target object is biased to implant ions. This reduces the level of contaminants, particulates and surface etching damage.

PLAD systems have a minimum breakdown voltage $V_{bd}$ at which the plasma ignites and ions can be implanted. This breakdown voltage $V_{bd}$ is defined by the physical characteristics of the system, including the cathode surface material, the type of gas present in the system, the pressure P of the gas in the system and the distance d from the cathode to the anode. For a given surface material and gas type, the breakdown voltage curve $V_{bd}$ is a function of P×d and is known as the Paschen curve. The process is well described in plasma physics texts. Typically, the minimum value for the breakdown voltage $V_{bd}$ is near Pd≈500 millitorr-cm. For $BF_3$, a common feed gas used for PLAD of Si, the minimum breakdown voltage $V_{bd}$≈−530 V. Other dopant feed-gas/substrate combinations will have similar minimum breakdown voltages $V_{bd}$. The implant energy of the ions in the plasma is directly proportional to the cathode to anode voltage in prior art PLAD systems.

In PLAD systems, the ion current to the cathode is a function of the applied voltage, gas pressure, and surface conditions. For voltages near $V_{bd}$, the current is low. As the voltage or the pressure is increased, the current increases. In order to increase current and thereby reduce implant times, it is desirable to operate at higher pressures and voltages above $V_{bd}$. Local surface conditions, surface temperature, material, material structure (crystal vs. amorphous), etc., also play a role in the local ion current.

It is envisioned that future generations of integrated circuits will require ultra-shallow junctions. Conventional PLAD systems, however, have implant energies, due to the breakdown voltage $V_{bd}$, which are too high for the production of some ultra-shallow junctions.

Thus, there is a need for a PLAD system capable of implanting dopant materials at low energies, i.e., voltages, and at high currents to permit formation of ultra-shallow junctions with short implant times.

SUMMARY OF THE INVENTION

According to a first aspect of the invention, a method of implanting ions in a target within a pulsed plasma doping system is provided. The method comprises providing an ignition voltage pulse $V_{plas}$ to an ionizable gas to create the ions for implantation; and providing an implantation voltage pulse $V_{imp}$ to the target to implant ions into the target, wherein the implantation voltage pulse $V_{imp}$ and the ignition voltage pulse $V_{plas}$ overlay in time at least partially and have one or more different parameters.

Preferably, the ignition voltage pulse $V_{plas}$ is coupled to a plasma ignition cathode; and the implantation voltage pulse $V_{imp}$ is coupled to an implantation cathode on which the target is mounted. The ignition voltage pulse $V_{plas}$ and the implantation voltage pulse $V_{imp}$ may be provided by, respectively, first and second high voltage pulse sources.

The implantation voltage pulse $V_{imp}$ may be a function of the ignition voltage pulse $V_{plas}$. This is accomplished, in one embodiment, by coupling a voltage divider network to the ignition voltage pulse $V_{plas}$; and generating the implantation voltage pulse $V_{imp}$ from the voltage divider network. The implantation voltage pulse $V_{imp}$ amplitude may be less than the ignition voltage pulse $V_{plas}$ amplitude.

The implantation voltage pulse $V_{imp}$ may be substantially concurrent with the ignition voltage pulse $V_{plas}$. Alternatively, the implantation voltage pulse $V_{imp}$ may start after a start of the ignition voltage pulse $V_{plas}$ and end prior to an end of the ignition voltage pulse $V_{plas}$. Still further, the implantation voltage pulse $V_{imp}$, may begin before and end after the ignition voltage pulse $V_{plas}$. The implantation voltage pulse $V_{imp}$ may occur after the ignition voltage pulse $V_{plas}$ has ended.

According to another aspect of the invention, a pulsed plasma doping system for implanting ions in a target is provided. The system comprises means for providing an ignition voltage pulse $V_{plas}$ to an ionizable gas to create the ions for implantation; means for providing an implantation voltage pulse $V_{imp}$ to the target to implant ions into the target; and means for controlling a timed relationship between the implantation voltage pulse $V_{imp}$ and the ignition voltage pulse $V_{plas}$ to overlay in time at least partially and have one or more different parameters.

In yet another aspect of the present invention, a pulsed plasma doping apparatus for implanting ions in a target is provided. The apparatus comprises a first high voltage pulse source to provide an ignition voltage pulse $V_{plas}$ to an ionizable gas to create the ions for implantation; and a first device to provide an implantation voltage pulse $V_{imp}$ to the target to implant ions into the target, wherein the implantation voltage pulse $V_{imp}$ and ignition voltage pulse $V_{plas}$ overlay in time at least partially and have one or more different parameters.

In still another aspect of the present invention, a pulsed plasma doping system for implanting ions in a target is provided. The system comprises a vacuum chamber to contain an ionizable gas; an anode coupled to a reference voltage, the anode disposed within the vacuum chamber; a plasma source cathode disposed within the vacuum chamber; a first high voltage pulse source to provide an ignition voltage pulse $V_{plas}$ to the plasma source cathode; an implantation cathode to support the target; and an implantation voltage pulse source to supply an implantation voltage pulse $V_{imp}$ to the implantation cathode. The implantation voltage pulse $V_{imp}$ and the ignition voltage pulse $V_{plas}$ overlay in time at least partially and have one or more different parameters.

BRIEF DESCRIPTION OF THE DRAWINGS

For a better understanding of the present invention, reference is made to the accompanying drawings, in which like reference numbers designate the same element and in which.

DETAILED DESCRIPTION

Figure 1:
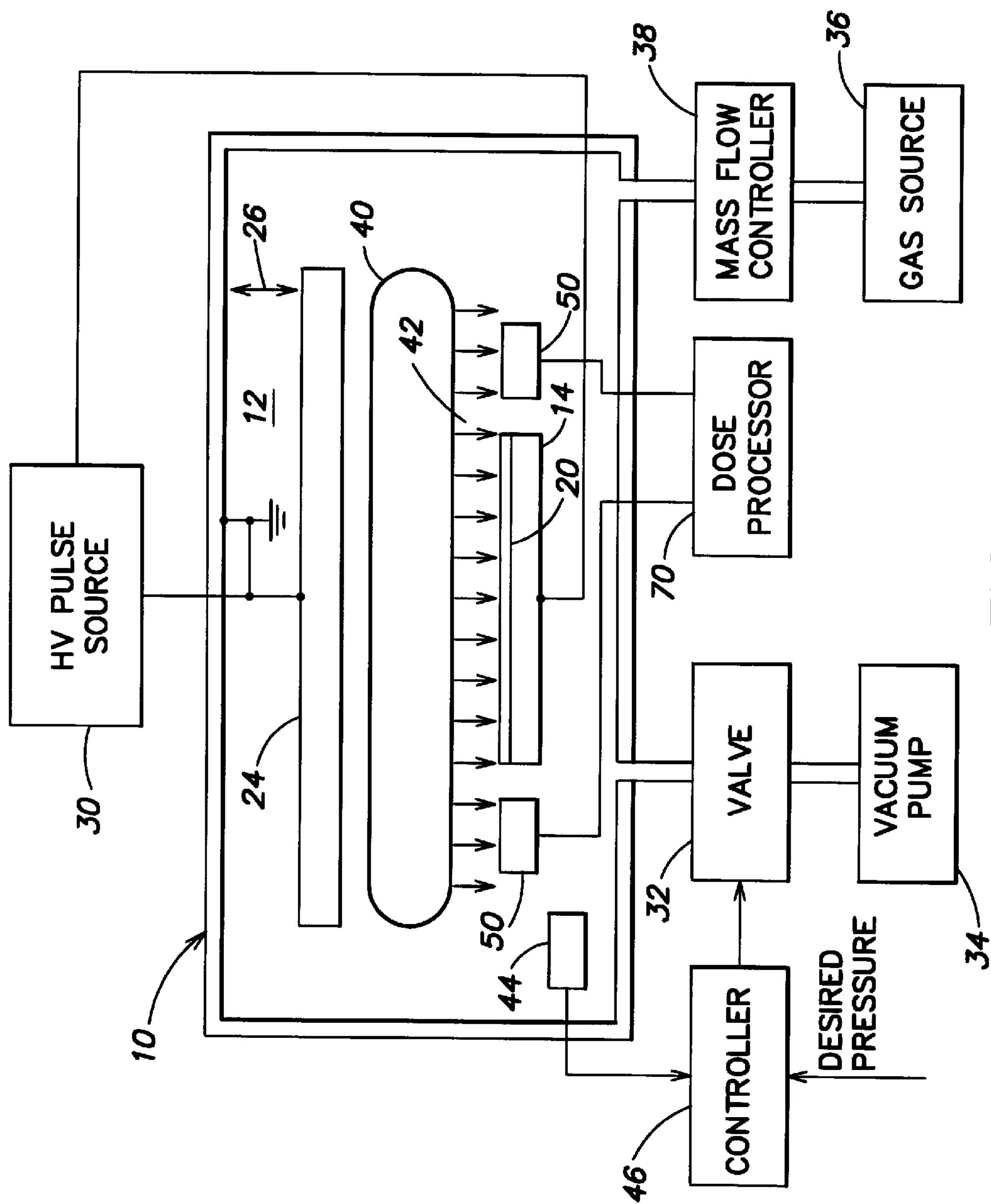
FIG. 1 is a schematic block diagram of a conventional plasma doping system.

An example of a conventional plasma doping system is shown schematically in FIG. 1. A plasma doping chamber 10 defines an enclosed volume 12. A platen (cathode) 14 positioned within chamber 10 provides a surface for holding a workpiece, such as a semiconductor wafer 20. Semiconductor wafers are only one example of possible target types. The invention is not limited to ion implantation in only semiconductor wafers. For example, ion implantation in metals for tools, automotive components, stamping dies and plastics is also possible. The wafer 20 may, for example, be clamped at its periphery to a flat surface of the platen 14. The platen 14 supports wafer 20 and provides an electrical connection to wafer 20. In one version, the platen 14 is substantially planar and has an electrically-conductive surface for supporting wafer 20. In another version, the platen 14 includes conductive pins for electrical connection to wafer 20.

An anode 24 is positioned within chamber 10 in spaced relation to the platen (cathode) 14. Anode 24 may be movable in a direction, indicated by arrow 26, perpendicular to platen 14. The anode 24 is typically connected to electrically-conductive walls of chamber 10, both of which may be connected to ground. In one version, the anode 24 and platen 14 are substantially parallel to one another.

The wafer 20 and the cathode 14 are connected to a high voltage pulse source 30, so that wafer 20 functions as a cathode. The pulse source 30 typically provides pulses in a range of about 100 to 10,000 volts, about 1 to 50 microseconds in duration and at a pulse repetition rate of about 100 Hz to 2 KHz. It will be understood that these pulse parameter values are given by way of example only and that other values may be utilized.

The enclosed volume 12 of chamber 10 is coupled through a controllable valve 32 to a vacuum pump 34. A gas source 36 is coupled through a mass flow controller 38 to chamber 10. A pressure sensor 44 located within chamber 10 provides a signal indicative of chamber pressure to a controller 46. The controller 46 compares the sensed chamber pressure with a desired pressure input and provides a control signal to valve 32. The control signal controls valve 32 so as to minimize the difference between the chamber pressure and the desired pressure. Vacuum pump 34, valve 32, pressure sensor 44 and controller 46 constitute a closed loop pressure control system. The pressure is typically controlled in a range of about one millitorr to about 500 millitorr, but is not limited to this range. Gas source 36 supplies an ionizable gas containing a desired dopant for implantation into the workpiece. Examples of ionizable gases include $BF_3$, $N_2$, Ar, $PF_5$ and $B_2H_6$. Mass flow controller 38 regulates the rate at which gas is supplied to the chamber 10. The configuration shown in FIG. 1 provides a continuous flow of process gas at a constant gas flow rate and constant pressure. The pressure and gas flow rate are preferably regulated to provide repeatable results.

In operation, wafer 20 is positioned on platen 14. Then the pressure control system, mass flow controller 38 and gas source 36 produce the desired pressure and gas flow rate within chamber 10. By way of example, the chamber 10 may operate with $BF_3$ gas at a pressure of ten millitorr. The pulse source 30 applies a series of high voltage pulses to the platen 14 and, thus to wafer 20, causing formation of a plasma 40 between wafer 20 and anode 24. As is known in the art, the plasma 40 contains positive ions of the ionizable gas from gas source 36. The plasma 40 further includes a plasma sheath 42 in the vicinity of platen 14. The electric field that is present between anode 24 and platen 14 during the high voltage pulse accelerates positive ions from plasma 40 across plasma sheath 42 toward platen 14 and the wafer 20. The accelerated ions are implanted into wafer 20 to form regions of impurity material.

The pulse voltage is selected to implant the positive ions to a desired depth in wafer 20. The number of pulses and the pulse duration are selected to provide a desired dose of impurity material (the positive ions) in wafer 20. The current per pulse is a function of pulse voltage, gas pressure, gas species, and any variable position of the electrodes. For example, the cathode to anode spacing may be adjusted for different voltages. A dose processor 70 is connected to current measuring devices 50 so as to measure the dose of positive ions being accumulated in the target wafer 20. In one system, the measuring devices 50 are Faraday cups. As is known, positive ions entering the Faraday cup produces a current in the circuit attached to the cup. The electrical current is indicative of the number of positive ions received per unit time, or ion current.

In order to provide a PLAD system and process in which the dopant species is implanted in the target wafer at low energies, the present invention separates the plasma ignition function from the ion implantation function. The separation of these functions maintains the advantages of the PLAD process over the PSII processes previously discussed, while providing additional advantages, including the ability to implant at very low energies and the ability to separately control the parameters of the plasma ignition pulse and the implant pulse.

Figure 2:
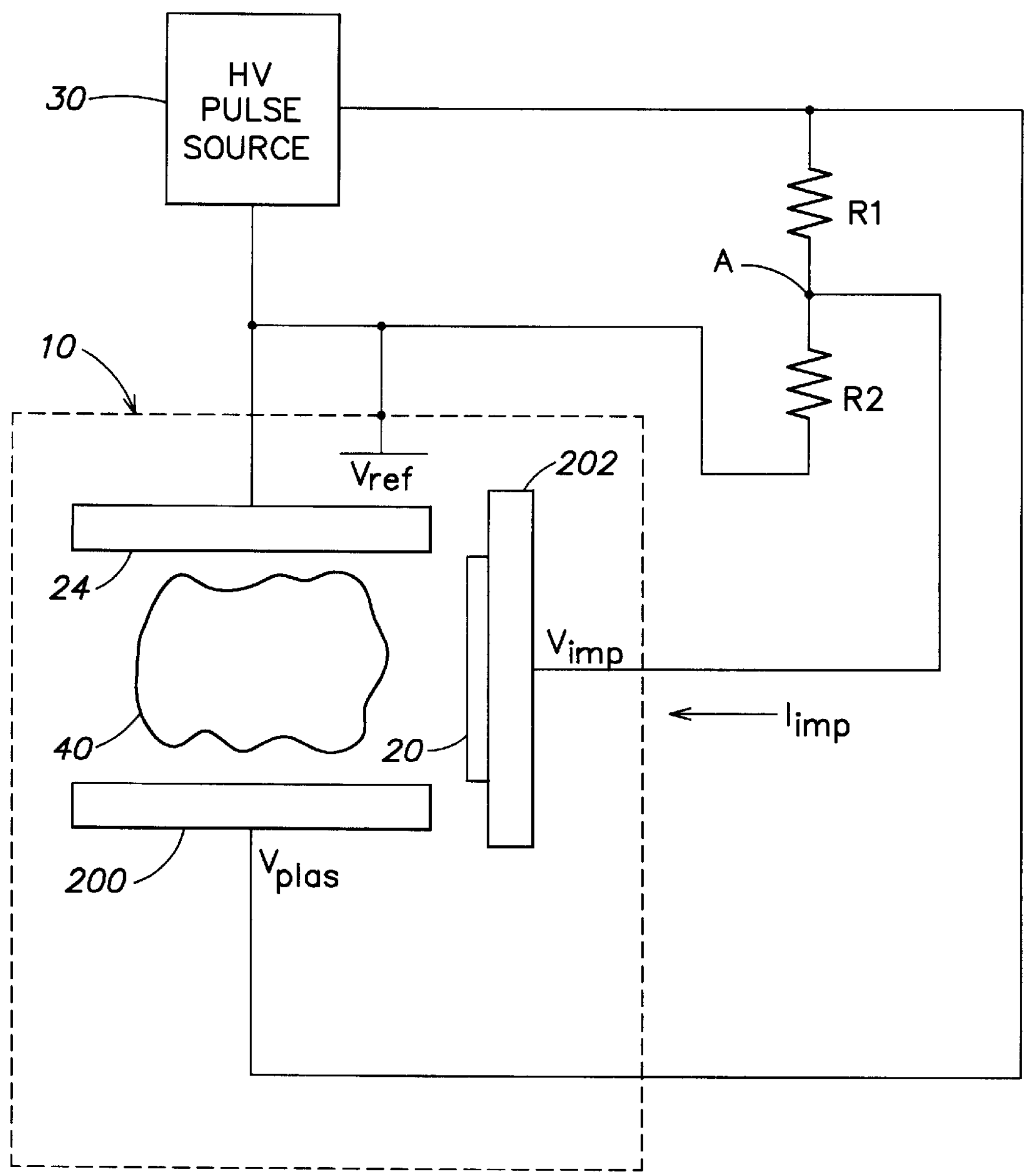
FIG. 2 is a schematic block diagram of a plasma doping system in accordance with a first embodiment of the present invention.

A plasma doping system according to a first embodiment of the present invention is shown in FIG. 2. A plasma source cathode 200 is coupled to the output of the high voltage pulse source 30. The target wafer 20 is positioned on an implantation cathode 202, separate from the plasma source cathode 200. Similar to the foregoing description of the conventional system, the wafer 20 is in electrical contact with the implantation cathode 202.

A voltage divider network including series resistors R1 and R2 is connected between the output of the pulse source 30 and a reference voltage $V_{REF}$. The reference voltage is typically ground, although other potentials may be used, depending on the application. The implantation cathode 202 is electrically coupled to a node A between resistors R1 and R2.

A plasma ignition voltage pulse $V_{plas}$ applied to the plasma source cathode 200 is sufficient to ignite a plasma and to maintain the plasma for the duration of the pulse. An implantation voltage pulse $V_{imp}$ on the implantation cathode 202 has an amplitude selected to produce a desired implant depth. The amplitude of the implantation voltage pulse $V_{imp}$ applied to the implantation cathode 202 is defined as follows:

$$V_{imp}=(R2/(R1+R2))(V_{plas}-(I_{imp}*R1))$$

where $V_{plas}$ is the voltage generated by the high voltage pulse source 30 and $I_{imp}$ is the current supplied to the implantation cathode 202. Voltage ratios of the voltage $V_{plas}$ to the implantation voltage $V_{imp}$ may be in the range of 1:1 to 10:1 or greater.

One or both of resistors R1 and R2 may be a variable resistor. Use of variable resistors allows flexibility in setting the amplitude of the implantation voltage $V_{imp}$ on the implantation cathode 202. The voltage pulse amplitude applied to the implantation cathode 202 can be adjusted to any desired value. As a result, the implantation depth can be carefully chosen. The voltage applied to the implantation cathode permits implantation voltages that are less than the voltage needed to ignite the plasma, including voltages below the Paschen curve.

The foregoing describes a system in which plasma doping may be performed at voltages below 500 volts. In a test performed by the inventors, with a silicon (Si) wafer and nitrogen ($N_2$) at a pressure of 200 millitorr and an ignition voltage pulse of approximately 700 volts with a pulse width of 20 microseconds, ions were implanted in the silicon wafer at an implant voltage of approximately 375 volts. Resistor R1 was approximately 4.27 kOhms and resistor R2 was 6.22 kOhms. The foregoing values are by way of example only and are not intended to be limiting. In addition, the present invention has been operated with an implantation voltage, i.e., the voltage on the implantation cathode, as low as eight-eight volts, with the expectation that the present invention will operate at even lower voltages.

The implantation cathode 202 is mechanically arranged so that the target wafer 20 is exposed to plasma 40. The exposure of wafer 20 to plasma 40 should be relatively uniform over the surface of wafer 20 to ensure uniform ion implantation.

In the embodiment of FIG. 2, the implantation cathode 202 is coupled to a voltage divider network including resistors R1 and R2. Thus, the implantation voltage pulse $V_{imp}$ amplitude is a function of the plasma voltage pulse $V_{plas}$ amplitude and is determined by the values of R1 and R2. However, the start and stop times of the pulses are the same. This may have an adverse effect on implant uniformity. Additionally, the implantation voltage $V_{imp}$ will always be less than the ignition voltage $V_{plas}$. Thus, the maximum implantation voltage is limited by $V_{plas}$. These issues are not present in a second embodiment of the present invention, where the implantation voltage pulse $V_{imp}$ and the ignition voltage pulse $V_{plas}$ are separately generated.

Figure 3:
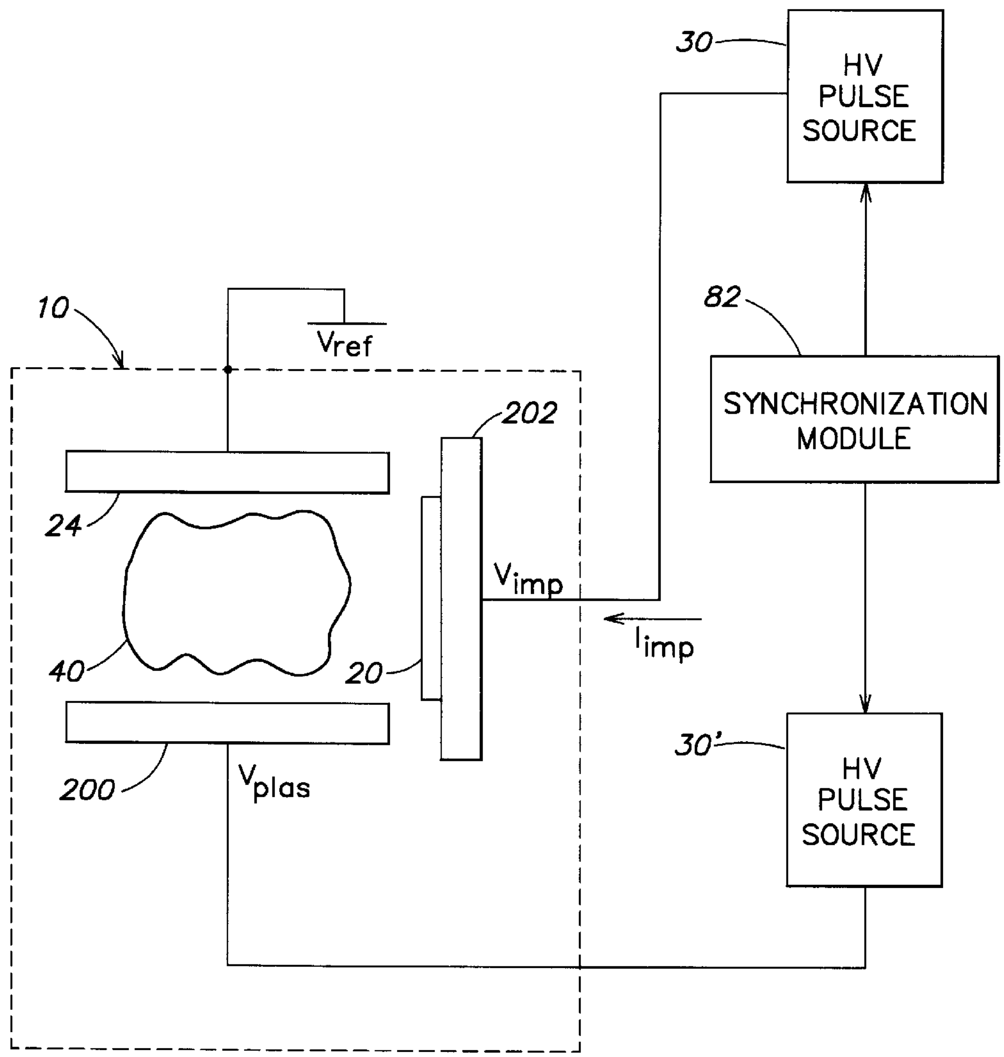
FIG. 3 is a schematic block diagram of a plasma doping system in accordance with a second embodiment of the present invention.

As shown in FIG. 3, two high voltage pulse sources 30, 30' are coupled, respectively, to the implantation cathode 202 and the plasma source cathode 200. Similar to the previous embodiments, the wafer 20 is disposed on the implantation cathode 202. The high voltage pulse source 30' outputs an ignition voltage pulse $V_{plas}$ for igniting the plasma 40. The other high voltage pulse source 30 outputs an implantation voltage pulse $V_{imp}$ for establishing an implantation voltage on the wafer 20.

In operation, the plasma 40 is started by the ignition voltage pulse $V_{plas}$ and is maintained for the duration of the ignition pulse. The plasma density is controlled by the ignition voltage pulse $V_{plas}$ which is independent of the implantation voltage pulse $V_{imp}$. The parameters of each pulse, including amplitude and pulse width, may be separately controlled. In addition, the relative timing of the pulses may be controlled. The implantation voltage pulse $V_{imp}$ may begin a predetermined time after the plasma ignition voltage pulse $V_{plas}$ is applied and may end before the end of the plasma ignition voltage pulse $V_{plas}$. As a result, initial instability in the plasma is avoided and the implant uniformity is improved. In another configuration, pulses may be set to occur simultaneously, similar to operation of the embodiment described above with the resistive network. Still further, the implantation voltage pulse $V_{imp}$, may begin before and end after the ignition voltage pulse $V_{plas}$. The implantation voltage pulse $V_{imp}$ may occur after the ignition voltage pulse $V_{plas}$ has ended. In the latter configuration, the implantation voltage pulse $V_{imp}$ runs in the "afterglow" since shortly after the ignition voltage pulse $V_{plas}$ is turned off, the plasma is still in the chamber. Additionally, the implant voltage pulse $V_{imp}$ amplitude can be adjusted to be either the same, greater than or less than the ignition voltage pulse $V_{plas}$. The inventors have demonstrated an eighty-eight volt implant of $BF_3$ to a six inch wafer at a current of 100 milliamps.

The timing relationship between the plasma ignition voltage pulse $V_{plas}$ and the implantation voltage pulse $V_{imp}$, and their respective durations and amplitudes, depend upon the particular result desired and the application. Various parameters must be considered including, but not limited to, the cathode surface material, the particular gas being used, the distance from the cathode to the anode, and the desired implantation depth.

Figure 4A:
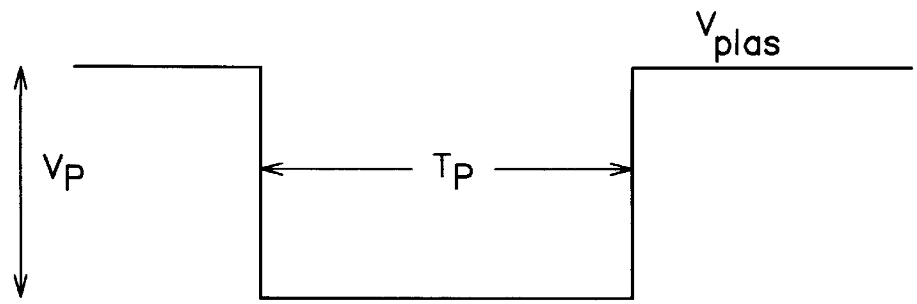
FIGS. 4A–4C are timing diagrams that illustrate operation of the embodiment shown in FIG. 3.
Figure 4B:
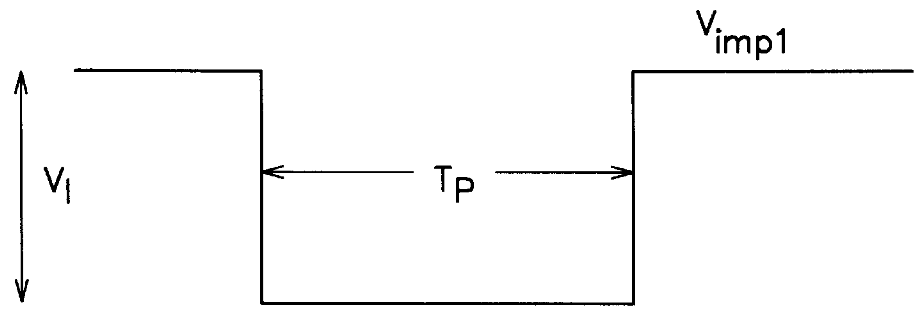

As shown in FIG. 4A, the plasma ignition voltage pulse $V_{plas}$ has an amplitude $V_p$ and a duration of $T_P$. In one embodiment, as shown in FIG. 4B, an implantation voltage pulse $V_{imp1}$ occurs substantially concurrently with the ignition voltage pulse $V_{plas}$, and, therefore, has a pulse width of $T_p$. The implantation voltage amplitude $V_I$, however, can be set to be either the same, greater than or less than the plasma voltage pulse amplitude $V_P$.

Figure 4C:
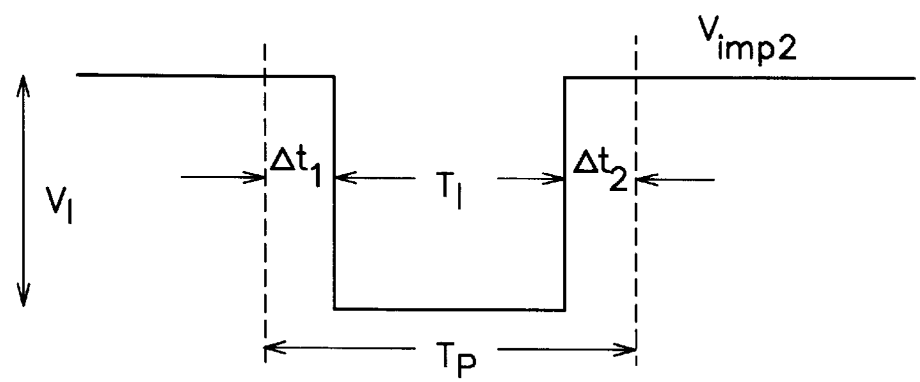

Alternately, as shown in FIG. 4C, the start of an implantation voltage pulse $V_{imp2}$ is delayed a time $\Delta t_1$, from the start of the ignition voltage pulse $V_{plas}$. The implantation voltage pulse $V_{imp}$ has a pulse width $T_I$ that ends $\Delta t_2$ prior to the end of the ignition voltage pulse $V_{plas}$. The other timing relationships between the ignition voltage pulse and the implantation voltage pulse, as discussed above, although not shown in a timing diagram, are also within the scope of the present invention.

The timed relationship between the ignition voltage pulse $V_{plas}$ and the implantation voltage pulse $V_{imp}$ is established by a synchronization module 82 connected to both of the high voltage pulse sources 30, 30'. The synchronization module 82 can include two pulse signal generators (not shown) that output, respectively, synchronization timing signals to the high voltage pulse sources. Pulse signals generators are well known in the art and are available from many different manufacturers. These generators are configured to establish a timed relationship between the high voltage pulse sources that, in turn, establish a timed relationship between $V_{plas}$ and $V_{imp}$.

The present invention has been described within the operation of a PLAD system using parallel plate anodes and cathodes. Various source cathode/implantation cathode geometries can also be used.

A first alternate configuration of the present invention utilizes a hollow cathode. Hollow cathodes used in PLAD systems are described in commonly assigned and co-pending patent application Ser. No. 09/427,869 filed on eve date herewith, the contents of which are incorporated herein in their entirety.

Figure 5:
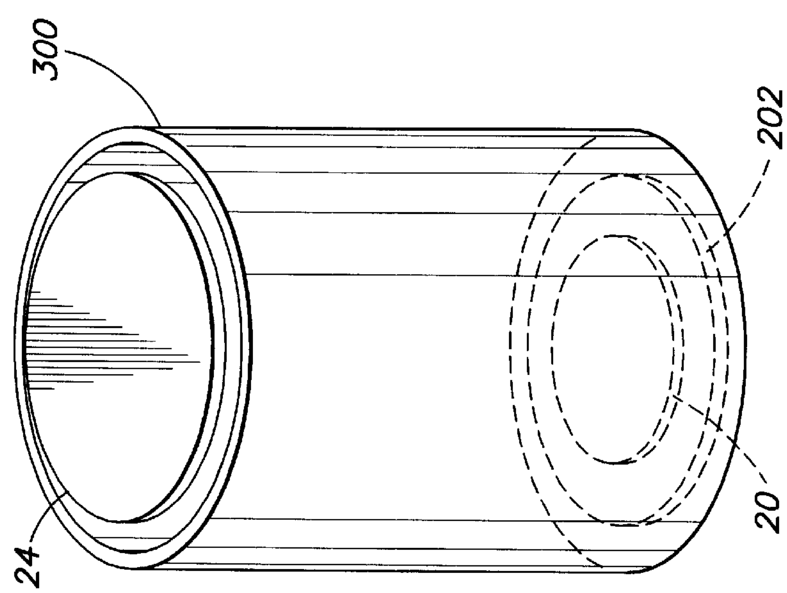
FIG. 5 is a first alternate arrangement of the present invention using a cylindrical hollow cathode.

As shown in FIG. 5, the anode 24 is disposed opposite implantation cathode 202. The anode 24 and implantation cathode 202 are arranged to be substantially parallel to one another. A hollow cylindrical cathode 300 is disposed around the volume between the anode 24 and the implantation cathode 202.

Figure 6:
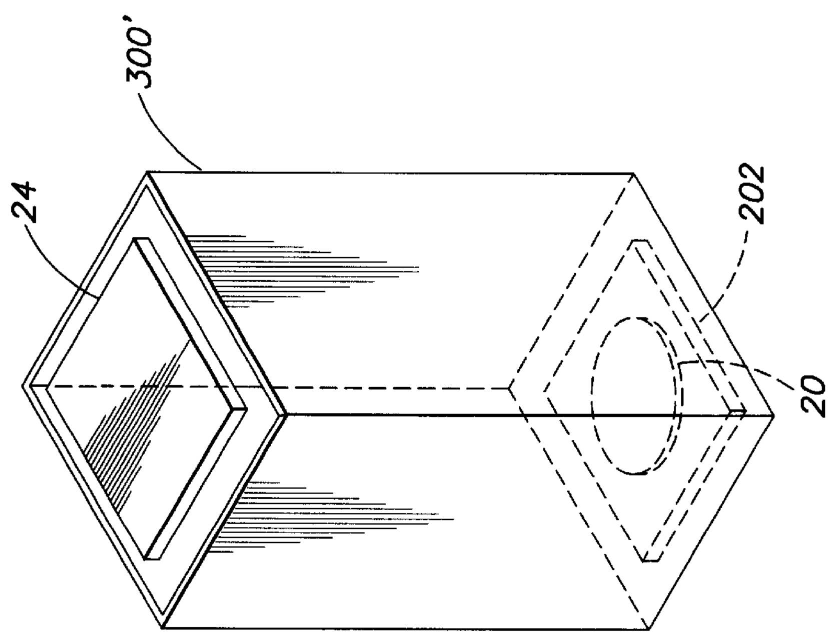
FIG. 6 is a second alternate arrangement of the present invention using a rectangular hollow cathode.

In a second alternate configuration of the present invention, as shown in FIG. 6, the anode 24 and the implantation cathode 202 are disposed substantially parallel to one another and are spaced apart from one another. A rectangular or square hollow cathode 300' is disposed around the volume between the anode 24 and the implantation cathode 202.

Figure 7:
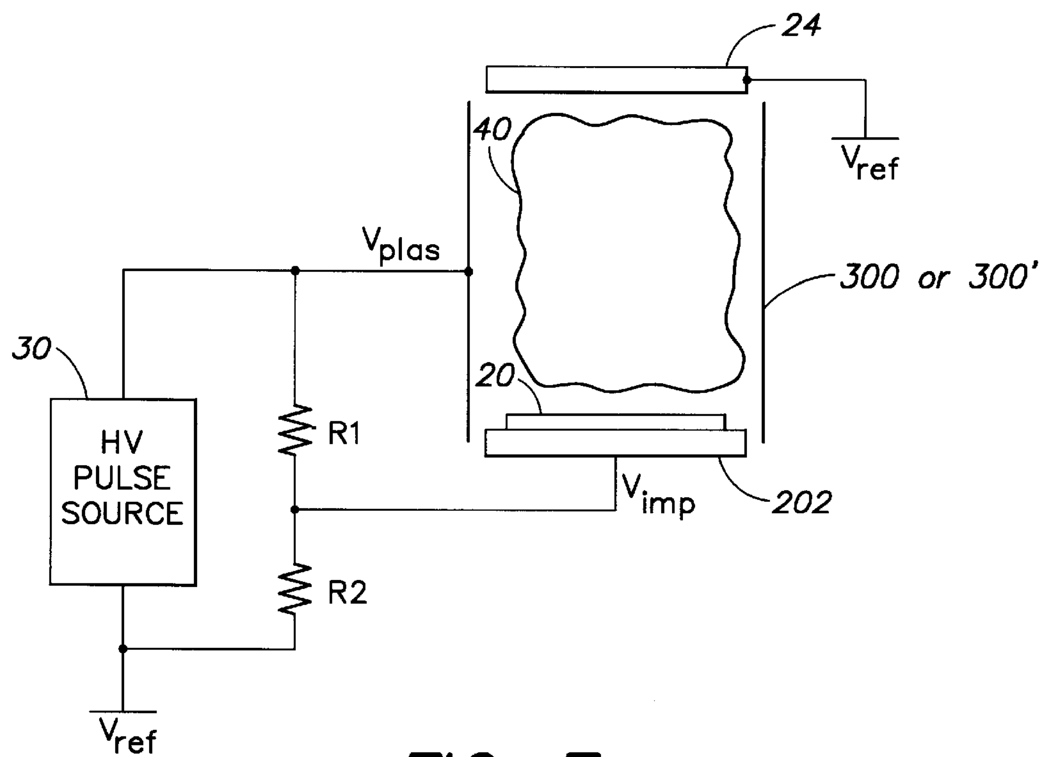
FIG. 7 is a schematic block diagram, in partial cross-section, showing a hollow cathode used with the embodiment of FIG. 2.

A schematic block diagram, with the hollow cathodes 300, 300' shown in cross-section, is shown in FIG. 7. The anode 24 is electrically coupled to a reference voltage terminal, typically ground, while the hollow cathode 300 or 300' is electrically coupled to the output of the pulse source 30 to receive the ignition voltage pulse $V_{plas}$. The anode reference potential can be other than ground in order to optimize plasma density and uniformity. The implantation cathode 202 receives the implantation voltage pulse $V_{imp}$ from the resistor network including resistors R1 and R2 as discussed above.

Figure 8:
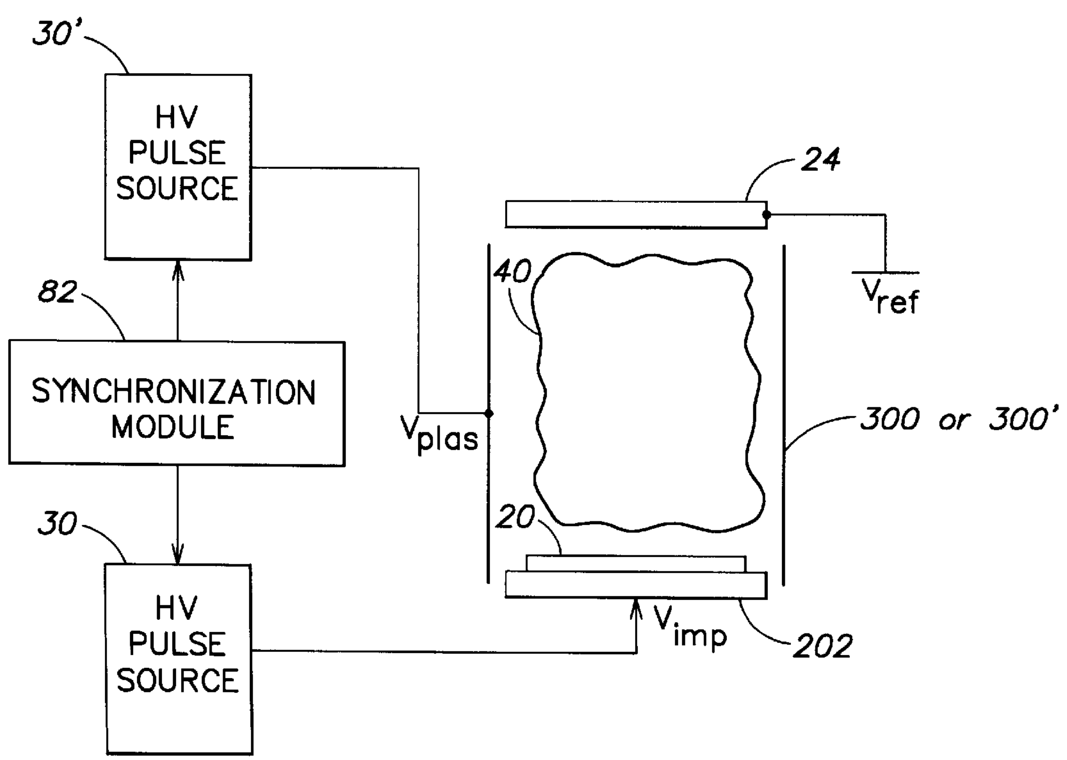
FIG. 8 is a schematic block diagram, in partial cross-section, showing a hollow cathode used with the embodiment of FIG. 3.

Alternatively, as shown in FIG. 8, two high voltage pulse sources 30, 30' may be coupled, respectively, to the implantation cathode 202 and to the hollow cathode 300 (or 300'). Operation of the system is the same as that described above with respect to FIG. 3.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method of implanting ions in a target, the method comprising acts of:

providing a pulsed plasma processing system comprising a vacuum chamber and electrodes disposed within the vacuum chamber, the electrodes including an anode, a plasma source cathode and an implantation cathode;

applying a plasma voltage pulse $V_{plas}$, having an amplitude $V_p$, between the anode and the plasma source cathode to produce the ions for implantation;

applying an implantation voltage pulse $V_{imp}$, having an amplitude $V_i$, between the anode and the implantation cathode that supports the target to implant the ions; and controlling amplitude $V_p$ and amplitude $V_i$ such that amplitude $V_p$ is larger than amplitude $V_i$.

2. The method of claim 1, wherein the plasma voltage pulse $V_{plas}$ and the implantation voltage pulse $V_{imp}$ are applied by first and second voltage sources.

3. The method of claim 1, wherein the implantation voltage pulse $V_{imp}$ and the plasma voltage pulse $V_{plas}$ overlap in time, at least partially.

4. The method of claim 1, wherein the implantation voltage pulse $V_{imp}$ is substantially concurrent with the plasma voltage pulse $V_{plas}$.

5. The method of claim 1, wherein the implantation voltage pulse $V_{imp}$ starts after a start of the plasma voltage pulse $V_{plas}$ and ends prior to an end of the plasma voltage pulse $V_{plas}$.

6. The method of claim 1, further comprising:

coupling the plasma voltage pulse $V_{plas}$ to a voltage divider network; and generating the implantation voltage pulse $V_{imp}$ from the voltage divider network.

7. The method of claim 1, wherein the act of applying an implantation voltage pulse $V_{imp}$ further includes applying an implantation voltage pulse $V_{imp}$ to the target to implant the ions in the target at an ultra-shallow implantation depth.

8. The method of claim 1, wherein amplitude $V_i$ is a function of amplitude $V_p$.

9. The method of claim 1, wherein amplitude $V_i$ is less than the minimum voltage needed to produce ions for implantation.

10. The method of claim 9, wherein amplitude $V_i$ is less than 375 Volts.

11. The method of claim 9 wherein amplitude $V_i$ is below a corresponding Paschen curve voltage.

12. The method of claim 1, further comprising the step of dividing the plasma voltage pulse $V_{plas}$ to provide the implantation voltage pulse $V_{imp}$.

13. The method of claim 1, further comprising the step of synchronizing the plasma voltage pulse $V_{plas}$ and the implantation voltage pulse $V_{imp}$ to overlap in time, at least partially.

14. The method of claim 1 wherein the steps of applying a plasma voltage pulse $V_{plas}$ and applying an implantation voltage pulse $V_{imp}$ are performed by synchronized first and second voltage sources.

15. The method of claim 1 wherein the implantation voltage pulse $V_{imp}$ and the plasma voltage pulse $V_{plas}$ overlap in time, at least partially.

16. The method of claim 1, further comprising the step of dividing the plasma voltage pulse $V_{plas}$ to provide the implantation voltage pulse $V_{imp}$.

17. The method of claim 1, wherein the step of applying a plasma voltage pulse $V_{plas}$ comprises applying the plasma voltage pulse $V_{plas}$ between the anode and a hollow plasma source cathode that surrounds a plasma discharge region between the anode and the implantation cathode.

18. In a pulsed plasma processing system, a method of implanting ions in a target, the method comprising acts of:

providing an ionizable gas within a vacuum chamber;

coupling a reference voltage to an anode disposed within the vacuum chamber;

supporting a target on an implantation cathode disposed within the vacuum chamber;

providing a plasma voltage pulse $V_{plas}$ having an amplitude $V_p$ to a plasma source cathode disposed within the vacuum chamber;

providing an implantation voltage pulse $V_{imp}$ having an amplitude $V_i$ to the implantation cathode; and controlling the amplitude $V_p$ and the amplitude $V_i$ such that the amplitude $V_p$ is larger than the amplitude $V_i$.

* * * * *